United States Patent

Yamamoto et al.

[11] Patent Number: 6,006,078
[45] Date of Patent: *Dec. 21, 1999

[54] RECEIVER WITH IMPROVED LOCK-UP TIME AND HIGH TUNING STABILITY

[75] Inventors: Yuji Yamamoto; Toshihito Ichikawa, both of Kawagoe, Japan

[73] Assignee: Pioneer Electronic Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/698,800

[22] Filed: Aug. 16, 1996

[30] Foreign Application Priority Data

Sep. 21, 1995 [JP] Japan .................................. 7-267926

[51] Int. Cl.⁶ .................................................. H04B 1/16
[52] U.S. Cl. ...................... 455/264; 455/192.2; 455/260; 455/265; 331/11
[58] Field of Search ..................................... 455/202, 209, 455/258, 259, 260, 264, 265, 318, 319, 197.1, 182.1, 182.2, 192.1, 192.2; 331/10, 11

[56] References Cited

U.S. PATENT DOCUMENTS

| | | |
|---|---|---|
| 4,280,104 | 7/1981 | Rzeszewski . |
| 4,365,349 | 12/1982 | Ogita et al. .............................. 455/260 |
| 4,607,393 | 8/1986 | Nokde et al. ............................ 455/264 |
| 5,150,078 | 9/1992 | Yang et al. .............................. 455/260 |
| 5,361,407 | 11/1994 | Swada et al. ............................ 455/209 |
| 5,424,687 | 6/1995 | Fukuda . |
| 5,548,811 | 8/1996 | Kumagai et al. ....................... 455/264 |

OTHER PUBLICATIONS

Gardner, Floyd M., Phaselock Techniques, John Wiley & Sons, N.Y. u.a., 2nd Ed., 1979, pp. 84–85.

*Primary Examiner*—Edward F. Urban
*Attorney, Agent, or Firm*—Sughrue, Mion, Zinn, Macpeak & Seas, PLLC

[57] ABSTRACT

A receiver has an oscillator for generating an oscillating signal at an oscillating frequency in accordance with an oscillation control signal, and receives a radio signal at a tuning frequency corresponding to the oscillating signal to demodulate the received radio signal. The receiver further includes a first frequency control loop system for generating a first control signal indicative of the difference in phase between a comparison signal generated by dividing the oscillating signal on the basis of the information on a channel selection frequency and a reference signal, and a second frequency control loop system for generating a second control signal indicative of a frequency difference between the oscillating frequency of the oscillating signal and the channel selection frequency. Either the first control signal or the second control signal is selectively supplied to the oscillator as an oscillation control signal.

2 Claims, 6 Drawing Sheets

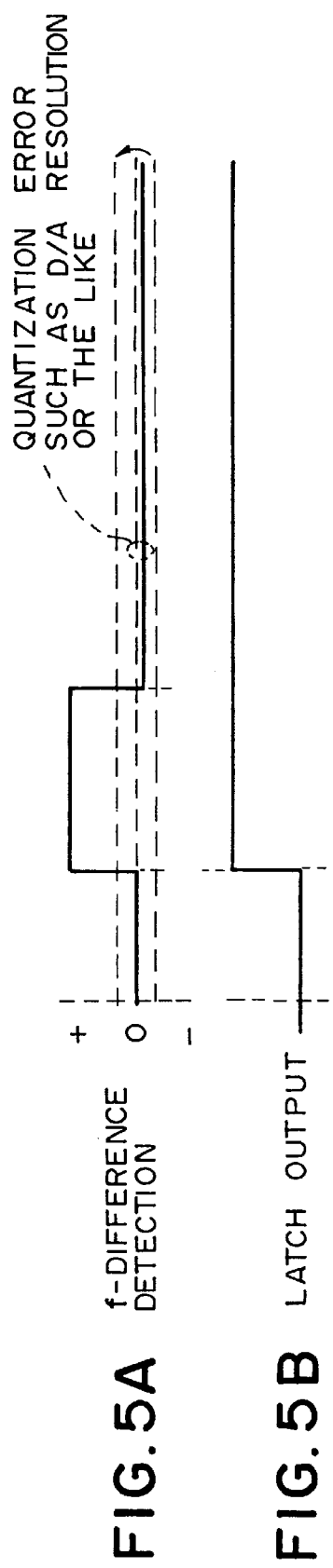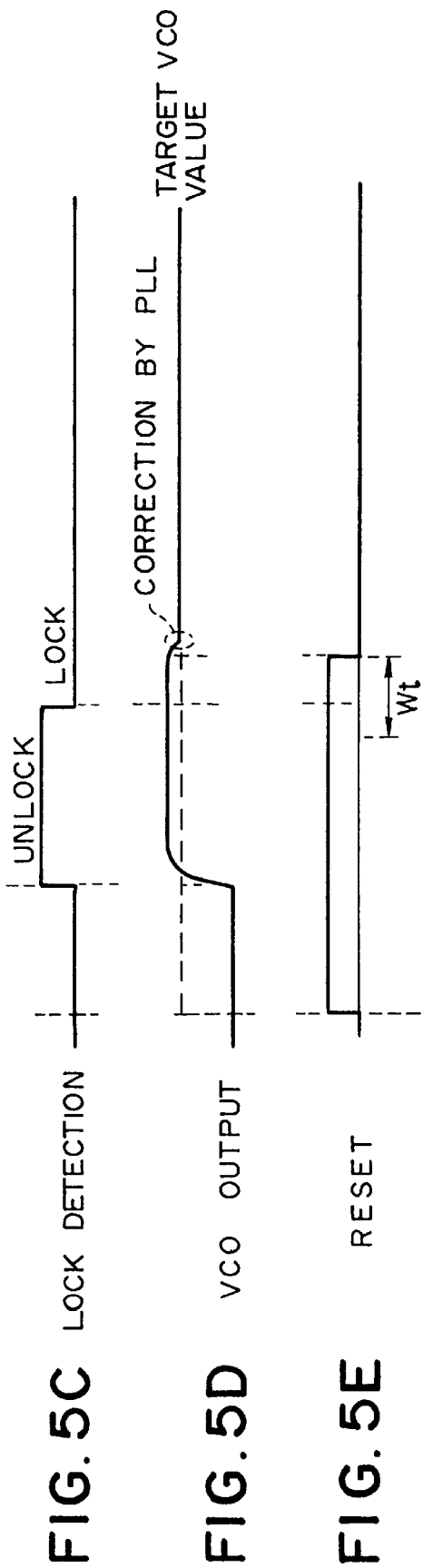
FIG. 5A f-DIFFERENCE DETECTION
FIG. 5B LATCH OUTPUT
FIG. 5C LOCK DETECTION
FIG. 5D VCO OUTPUT
FIG. 5E RESET

RECEIVER WITH IMPROVED LOCK-UP TIME AND HIGH TUNING STABILITY

BACKGROUND OF THE INVENTION

1. Field of the Invention

The present invention relates to a receiver which can tune a reception frequency to a desired frequency, and more particularly to a receiver which reduces a period of time required by the reception frequency to stabilize at the desired frequency when the reception frequency is changed.

2. Description of the Related Background Art

A receiver for receiving modulated broadcast waves such as FM broadcast waves and AM broadcast waves, which can vary a tuning frequency, or a reception frequency by changing an oscillating frequency of a local oscillator arranged therein, tunes to a frequency of a desired broadcasting station, demodulates a modulated signal from a received radio signal, and outputs the demodulated signal. The local oscillator is provided for control setting the tuning frequency at a frequency of a broadcasting station to be selected. Generally, a frequency synthesizer using a PLL (Phase Locked Loop) circuit is known as the local oscillator.

In the frequency synthesizer, as illustrated in FIG. 1, a signal having a reference frequency fr and an output signal of a programmable divider 104 are supplied to a phase comparator 101. The phase comparator 101 detects the difference in phase between both the input signals and outputs an error pulse Eo indicative of the phase difference. The error pulse Eo output from the phase comparator 101 is smoothed by a low pass filter (LPF) 102 and then supplied to a voltage controlled oscillator (hereinafter abbreviated as "VCO") 103. The VCO 103 generates an oscillating signal having an oscillating frequency fo according to an output voltage VD of the LPF 102. The oscillating signal is output and then supplied to the programmable divider 104. The programmable divider 104 divides the oscillating signal from the VCO 103 by a frequency division ratio 1/Mi, and outputs the divided signal with frequency fv to the phase comparator 101. These components 101 to 104 form a loop. Therefore, the oscillating frequency fo by the VCO 103 is controlled by the error pulse Eo from the phase comparator 101, so that the oscillating frequency by the VCO 103 converges to a frequency to be set and then is maintained.

A frequency division value Mi in the programmable divider 104 is changed by a program input from a controller, not shown, in accordance with the frequency to be set when a reception frequency is changed, such that the oscillating frequency of the VCO 103 can be arbitrarily changed by changing the frequency division value Mi.

In the frequency synthesizer as mentioned above, the oscillating frequency fo of the VCO converges to an integer multiple of the reference frequency fr in principle. Therefore, tuning stability of a receiver adapted to receive broadcast waves at a tuning frequency based on the oscillating frequency fo is determined by the accuracy of the reference frequency fr.

Since the frequency synthesizer using a PLL circuit is required to satisfy several contradictory requirements such as stable operation of a loop system, a short time until phase lock is achieved (lock up time), less noise in the loop system when the phase is locked, and so on, a loop constant of the PLL circuit set by laying emphasis only on the lock up time would cause unstable operations of the loop system and result in an unpracticable frequency synthesizer.

For this reason, since conventional frequency synthesizers using a PLL circuit set a loop constant so as to satisfy the above-mentioned several requirements in a practically tolerable range, it is difficult to significantly reduce the lock up time. For changing a reception frequency, a demodulated output is attenuated by muting.

SUMMARY OF THE INVENTION

It is an object of the present invention to provide a receiver which is capable of reducing a period of time required for stabilizing a reception frequency at a desired frequency when the reception frequency is changed to the desired frequency, in order to eliminate a sense of incompatibility in hearing associated with a change of the reception frequency.

The receiver according to the present invention, which has oscillating means for generating an oscillating signal at an oscillating frequency in accordance with an oscillation control signal, and receives a received radio signal at a tuning frequency corresponding to the oscillating frequency of the oscillating signal to demodulate the received signal, is characterized by comprising holding means for holding information on an input channel selection frequency, a first frequency control loop system for generating a first control signal indicative of the difference in phase between a comparison signal generated by dividing the oscillating signal on the basis of the information on the channel selection frequency and a reference signal, a second frequency control loop system for generating a second control signal indicative of a frequency difference between the oscillating frequency of the oscillating signal and the channel selection frequency, and a selection controller for selectively supplying the oscillating means with one of the first control signal and the second control signal as the oscillation control signal.

Since the receiver according to the present invention is configured as described above, the first frequency control loop system and the second frequency control loop system can be appropriately selected, thereby making it possible to achieve an improved lock up time and a high tuning stability.

BRIEF DESCRIPTION OF THE DRAWINGS

FIGS. 4A–4I are time charts illustrating the operation of the oscillation controller when the receiver according to the present invention changes a channel selection frequency;

FIGS. 5A–5E are time charts illustrating the operation of the oscillation controller when switching from a second frequency control loop to a first frequency control loop is performed.

DETAILED DESCRIPTION OF THE PREFERRED EMBODIMENT

An embodiment of the present invention will hereinafter be described in detail with reference to the accompanying drawings.

Figure 1:
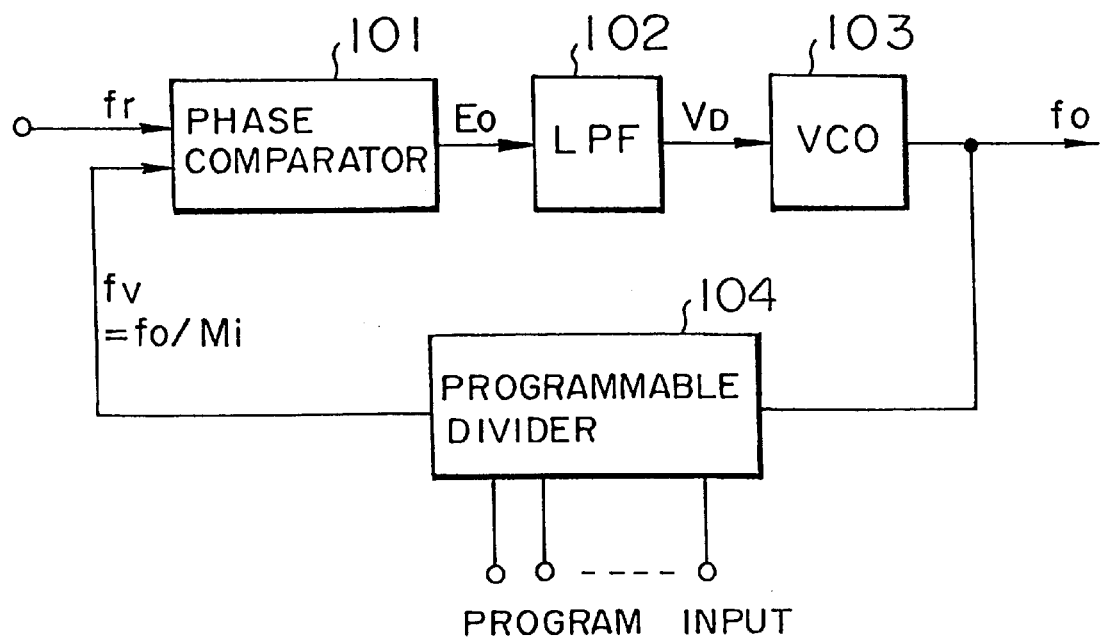
FIG. 1 is a block diagram illustrating a conventional frequency synthesizer using a PLL circuit.
Figure 2:
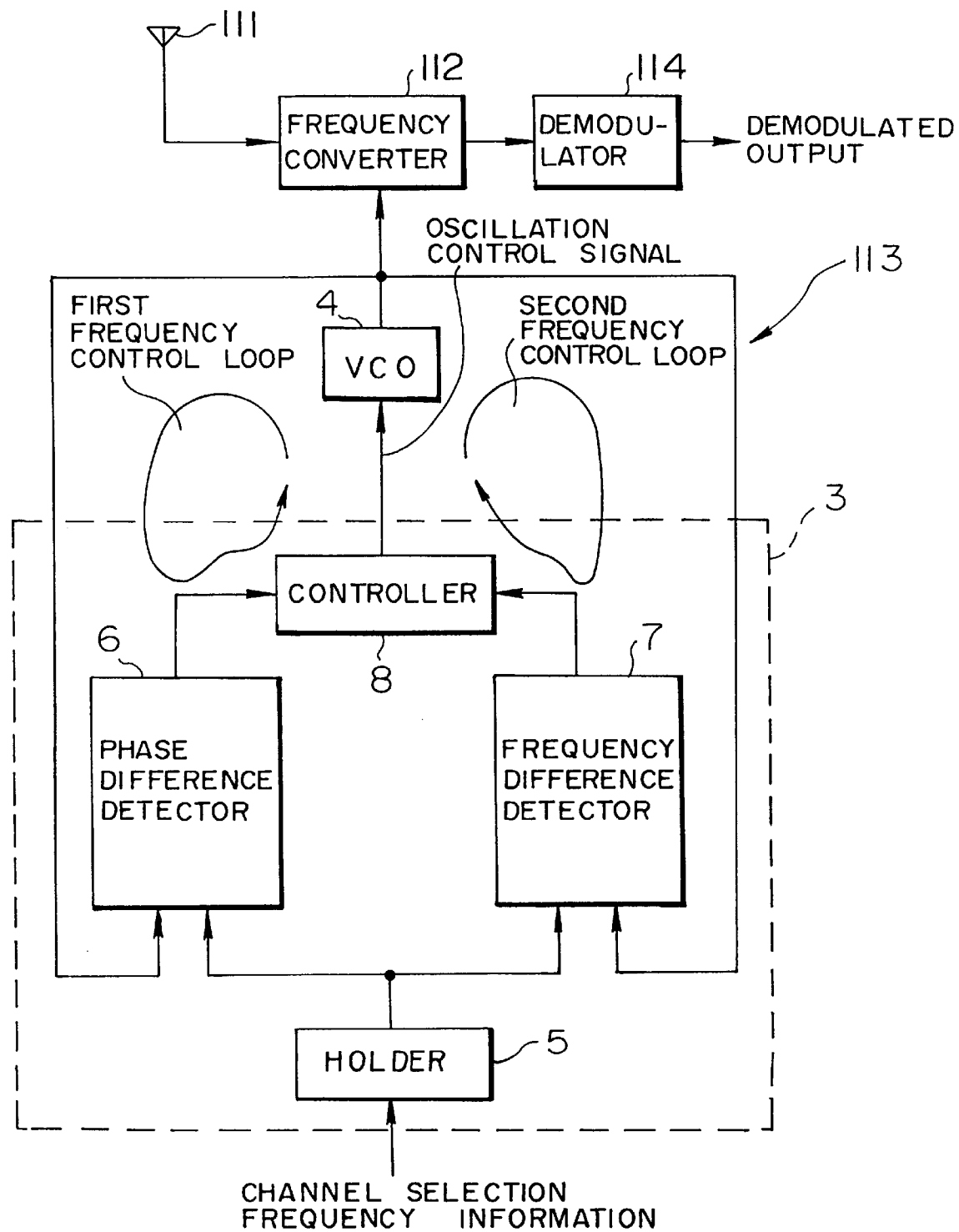
FIG. 2 is a block diagram illustrating a main portion of a receiver to which the present invention is applied.

FIG. 2 is a block diagram illustrating a main portion of a receiver which embodies the present invention.

In the illustrated receiver, radio signals received by an antenna 111 are supplied to a frequency converter 112. The frequency converter 112 mixes the received radio signals with an oscillating signal supplied from a local oscillator 113 to obtain a received signal of a tuning frequency at an intermediate frequency. The received radio signal of the tuning frequency is demodulated by a demodulator 114 including an intermediate frequency amplifier stage.

The local oscillator 113 includes a VCO 4, the oscillating frequency of which can be varied under the control of an oscillation controller 3. The oscillation controller 3 is provided with a holder 5 for holding channel selection frequency information supplied thereto from a CPU, not shown, or the like, i.e., information on the oscillating frequency of the VCO 4 necessary to channel selection. An output of the holder 5 is supplied to a phase difference detector 6 and a frequency difference detector 7. The phase difference detector 6 detects the difference in phase between a signal generated by dividing an output of the VCO 4 based on the channel selection frequency information and a reference signal. The frequency difference detector 7 detects the difference in frequency between the output of the VCO 4 and the channel selection frequency information. Respective detection outputs of the phase difference detector 6 and the frequency difference detector 7 are supplied to a selection controller 8. The selection controller 8 supplies one of the detection signals from either the phase difference detector 6 or the frequency difference detector 7 to the VCO 4 as a control signal. The VCO 4 generates an oscillating signal having a frequency or a phase according to the control signal from the selection controller 8.

It should be noted that the channel selection frequency information refers to an oscillating frequency of the VCO 4 corresponding to a transmission frequency of a desired broadcasting station. For example, the sum of the intermediate frequency of the intermediate frequency amplifier stage and the oscillating frequency is equal to the transmission frequency of the desired broadcasting station. As illustrated in FIG. 2, a first frequency control loop (phase comparison loop) for controlling the VCO 4 based on a phase difference detected by the phase difference detector 6 and a second frequency control loop (frequency comparison loop) for controlling the VCO 4 based on a frequency difference detected by the frequency difference detector 7 are formed in the oscillation controller 3.

The oscillation controller 3 constituted as described above is first supplied with frequency division value data indicative of a new oscillating frequency of the VCO 4 from the CPU which performs processing associated with general operations of the receiver including designation of a channel selection frequency, processing of input information from a user, display processing, and so on. The supplied frequency division value data is held in the holder 5.

The selection controller 8 selects the second frequency control loop including the frequency difference detector 7. The frequency difference detector 7 calculates a frequency difference between a current oscillating frequency of the VCO 4 and a target oscillating frequency of the VCO 4 in accordance with the current oscillating frequency of the VCO 4 and the frequency division value data held in the holder 5. A signal indicative of the frequency difference is supplied from the frequency difference detector 7 to the selection controller 8 which controls the oscillating frequency of the VCO 4 in accordance with the signal indicative of the frequency difference. In other words, the oscillating frequency of the VCO 4 is controlled by the second frequency control loop.

When the oscillating frequency of the VCO 4 is roughly adjusted near the target oscillating frequency by the second frequency control loop, the selection controller 8 selects the first frequency control loop including the phase difference detector 6. In the first frequency control loop, the phase difference detector 6 detects the difference in phase between a signal generated by dividing the oscillating signal of the VCO 4 by a frequency division ratio based on the channel selection frequency information and the reference signal, and supplies a signal indicative of the phase difference to the VCO 4 through the selection controller 8 for finely adjusting the oscillating frequency of the VCO 4. In other words, a lock up time is reduced by the rough adjustment for promptly bringing the oscillating frequency of the VCO 4 near the target frequency by the second frequency control loop, and a tuning stability is ensured by finely adjusting the oscillating frequency of the VCO 4 by the first frequency control loop.

Figure 3:
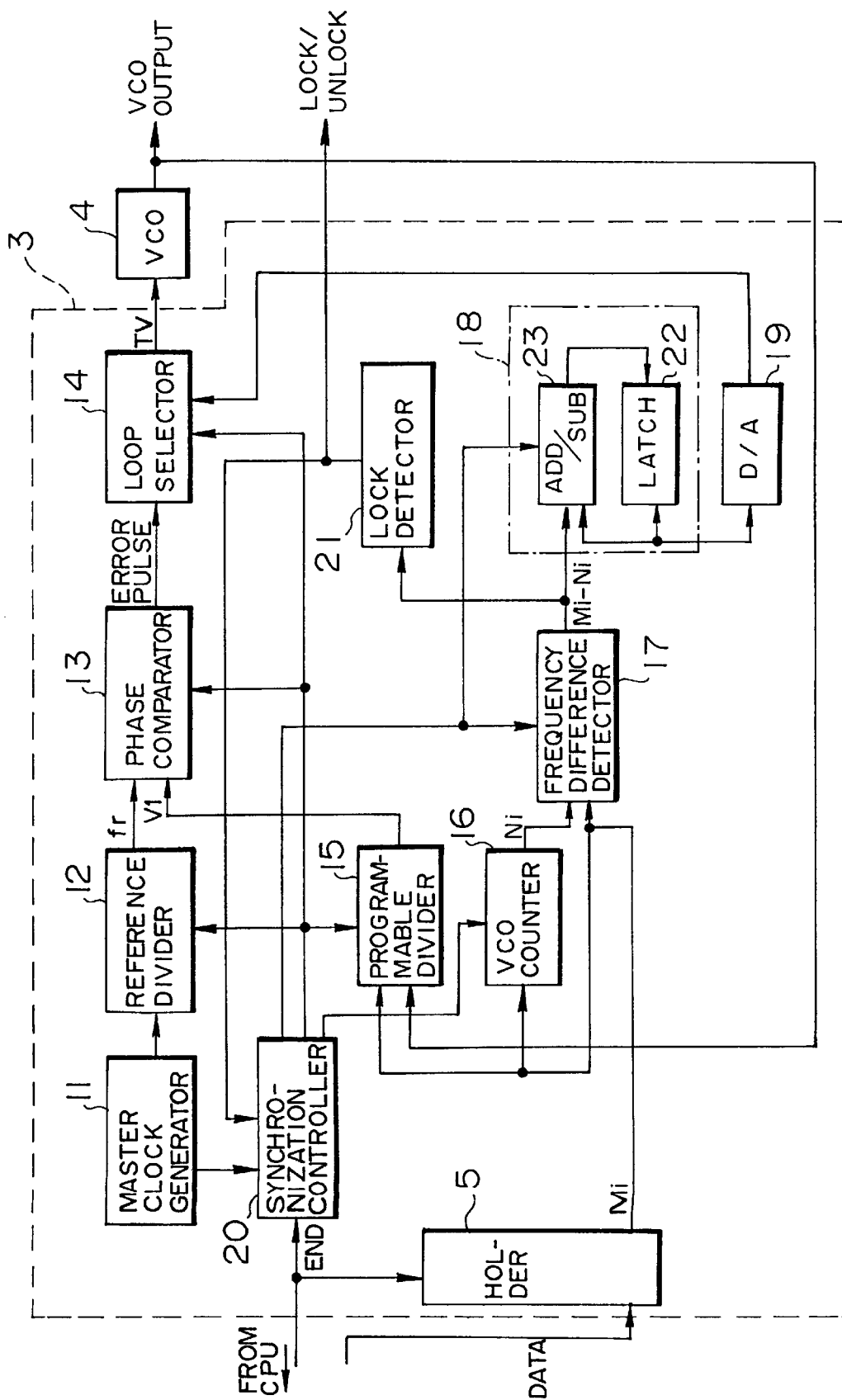
FIG. 3 is a block diagram illustrating a specific structure of an oscillation controller in the receiver of FIG. 2.

FIG. 3 illustrates the oscillation controller 3 in FIG. 2 in detail. In the illustrated oscillation controller 3, a phase comparator 13, a loop selector 14, and a programmable divider 15 constitute the first frequency control loop system. A VCO counter 16, a frequency difference detector 17, a digital charge pump 18, and a D/A converter 19 constitute the second frequency control loop system. A master clock generator 11 generates a master clock pulse, and a reference divider 12 divides the master clock pulse to generate the reference signal fr for the phase comparison in the first frequency control loop. The reference signal fr generated by the reference divider 12 is supplied to the phase comparator 13. The oscillation controller 3 further comprises a synchronization controller 20 including a counter and so on for controlling operations of respective components, and a lock detector 21 for determining whether or not a frequency difference detected by the frequency difference detector 17 is within a predetermined range, as well as the holder 5 composed, for example, of shift registers for holding the frequency division value data Mi.

The digital charge pump 18 is composed of a latch circuit 22 and an adder/subtractor 23 for executing addition or subtraction.

Next, the operation of the oscillation controller 3 constructed as described above will be described with reference to time charts of FIGS. 4A–4I in connection with an example in which an oscillating frequency $f_{vco}'$ currently set in the VCO 4 is changed to an oscillating frequency $f_{vco}$ instructed by the CPU.

To change the oscillating frequency of the VCO 4 to $f_{vco}$, first, frequency division value data Mi corresponding to the oscillating frequency $f_{vco}$ is input from the CPU to the oscillation controller 3, and the input frequency division value data Mi is held in the holder 5. In addition, the CPU outputs end identifying data (data END) indicative of the end of data transfer, as illustrated in FIG. 4A, to the synchronization controller 20. The synchronization controller 20, responsive to the end identifying data, totally controls respective components of the oscillation controller 3. In other words, the end identifying data serves as the basis of the operation of the synchronization controller 20.

The synchronization controller 20, upon receiving the end identifying data, outputs a countable pulse having a predetermined duration 1/fr synchronized with a master clock to the VCO counter 16. The predetermired duration 1/fr is determined by a count value of a counter in the synchronization controller 20.

In synchronism with the generation of the countable pulse, a reset signal as illustrated in FIG. 4H is generated from the synchronization controller 20. The reset signal controls output states of the loop selector 14 and the phase comparator 13 to select a control loop, as well as controls respective dividing operations of the reference divider 12 and the programmable divider 15.

Assuming herein that the second frequency control loop based on frequency difference has been selected instead of the first frequency control loop based on phase comparison, the reference divider 12 and the programmable divider 15 are prohibited from performing their respective dividing operations, thus causing the output of the phase comparator 13 to be in a high impedance state.

The VCO counter 16 measures the oscillating frequency $f_{vco}'$ of the VCO 4 input thereto while the countable pulse is being input, i.e., during a high level of the countable pulse, to output a count value Ni corresponding to the measured frequency.

The synchronization controller 20 outputs a synchronization signal illustrated in FIG. 4C after the count is terminated. Output timing of the synchronization signal is managed by the synchronization controller 20 similarly to the countable pulse. The frequency difference detector 17, upon receiving the synchronization signal, calculates the difference between the output Ni of the VCO counter 16 and the frequency division value held in the holder 5, and outputs the calculation result Mi−Ni indicative of the frequency difference. Specifically, assuming that the output duration of the countable pulse is equal to one period (1/fr) of the reference signal fr, the count value Ni is expressed by Ni=$f_{vco}'$/fr, and the held frequency division value data Mi is expressed by Mi=$f_{vco}$/fr.

Thus, the difference between the frequency division value data Mi and the count value Ni is expressed by Mi−Ni= ($f_{vco}$−$f_{vco}'$), so that the difference between the current oscillating frequency $f_{vco}'$ of the VCO 4 and the target frequency $f_{vco}$ is derived by calculating the difference Mi−Ni. Since the calculation result is in a relative relation with $f_{vco}'$ and $f_{vco}$ and can take positive and negative values, data for identifying whether the output data is positive or negative is of course added to the output data Mi−Ni.

The frequency difference Mi−Ni calculated by the frequency difference detector 17 is input to the digital charge pump 18. The digital charge pump 18 is composed of the adder/subtractor 23 and the latch circuit 22 as mentioned above. Digital data corresponding to the current output ($f_{vco}'$) of the VCO 4 held in the latch circuit 22 and the input frequency difference data Mi−Ni are subjected to addition or subtraction in the adder/subtractor 23 in synchronism with the synchronization signal from the synchronization controller 20.

Since the calculation result can be identified as positive or negative as mentioned above, the identifying data instructs the adder/subtractor 23 which of addition and subtraction it should perform. Taking FIG. 4D as an example, since the signal of FIG. 4D shows a positive frequency difference, addition is performed in the adder/subtractor 23. The calculation result, i.e., the result of addition or subtraction in the adder/subtractor 23 is again held in the latch circuit 22, thus completing the change of held data.

The data held in the latch circuit 22 is converted by the D/A converter 19 into an analog voltage value TV for actually driving the VCO 4. Therefore, as the held data is changed as illustrated in FIG. 4E, the oscillating frequency of the VCO 4 is changed following the output of the latch circuit 22, as illustrated in FIG. 4F.

The VCO 4 has a resonance circuit formed of a known variable capacitor, capacitor, coil, and so on. For this reason, when an output voltage of the D/A converter 19 is changed, the oscillating frequency of the VCO 4 cannot instantaneously follow the output voltage, thus resulting in a time constant indicated in FIG. 4F. Therefore, if the next counting operation of the VCO oscillating frequency is started before the output frequency of the VCO 4 is stabilized, a frequency detected by the VCO counter 16 will not be reliable in consequence.

To avoid this inconvenience, the synchronization controller 20 detects the lapse of a wait time Wt by a counter built therein in order to prevent the VCO counter 16 from starting the next counting operation of the VCO oscillating frequency until the oscillating frequency of the VCO 4 becomes stable.

The frequency difference Mi−Ni detected by the frequency detector 17 is also input to a lock detector 21. The lock detector 21, composed of a counter and so on, determines whether or not the input frequency difference Mi−Ni is within a predetermined range (lock range) indicated in FIG. 4D, in synchronism with the frequency difference detection output. The output state of the lock detector 21 is at low level indicative of lock when the frequency difference Mi−Ni is within the lock range, and at high level indicative of unlock when out of the lock range, as illustrated in FIG. 4G.

It will be understood that the lock detector 21 is provided to detect whether or not the oscillating frequency of the VCO 4 has reached near the target frequency $f_{vco}$ by controlling the oscillating frequency of the VCO 4 using the second frequency difference control loop.

After the wait time Wt has elapsed, the synchronization controller 20 again outputs the countable pulse to the VCO counter 16, as illustrated in FIG. 4B. At this time, if the oscillating frequency of the VCO 4 has been sufficiently adjusted by rough adjustment based on the frequency difference Mi−Ni, the oscillating frequency has reached near the target frequency $f_{vco}$. Thus, the frequency difference calculated by the frequency difference detector 17 by similar processing to the previous time indicates substantially zero, and the frequency difference detection output is changed on the basis of the current frequency difference detection, as illustrated in FIG. 4D.

If the frequency difference calculated this time is within the lock range, the lock detector 21 inverts the output to the low level, as illustrated in FIG. 4G, to indicate the synchronization controller 20 that the VCO 4 is in a locked state.

The synchronization controller 20, when receiving the input of the low level signal indicative of the locked state, recognizes that the oscillating frequency of the VCO 4 has reached near the target frequency $f_{vco}$ by roughly adjusting the oscillating frequency of the VCO 4 using the second frequency control loop.

The synchronization controller 20, upon detecting the low level signal indicative of the locked state, again inverts the output level of the reset signal as illustrated in FIG. 4H. The synchronization controller 20, by outputting the low level reset signal, instructs the loop selector 14 and the phase comparator 13 to select the first frequency control loop based on phase comparison, and controls the reference divider 12 and the programmable divider 15 to simultaneously start their dividing operations.

The simultaneous start of the dividing operations in the dividers 12, 15 will be described below. The first frequency control loop relying on phase difference detection is based on a phase difference, where the phase comparator 13 detects the difference in phase between the input reference signal fr and a comparison signal V1. Thus, even if the input reference signal fr is equal to the comparison signal V1 in frequency, the phase comparator 13 detects a phase error pulse if they are different in phase.

On the other hand, the second frequency control loop relying on frequency difference detection performs a control based on frequency difference, so that if the second frequency control loop is inadvertently switched to the first frequency control loop based on a different operation principle, a phase error pulse is output from the phase comparator 13 even if both the input signals are equal in frequency. Therefore, when the control loop is switched from one to the other, the reference signal fr and the comparison signal V1, both input to the phase comparator 13, are matched in phase so as to prevent the phase comparator 13 from outputting the unnecessary error pulse.

Thus, basic operations performed when the channel selection frequency is changed has been described.

Next, the fine adjustment of an output frequency of the VCO 4, after the first frequency control loop based on phase comparison is selected instead of the second frequency loop based on frequency difference will be described with reference to FIGS. 5A–5E.

Since FIGS. 5A, 5B, 5C, and 5E correspond to FIGS. 4D, 4E, 4G, and 4H, respectively, detailed descriptions thereon are omitted.

When the second frequency control loop is switched to the first frequency control loop by the Detection of a locked state, the output frequency of the VCO 4 is finely adjusted on the basis of an error pulse output from the phase compactor 13, as illustrated in FIG. 5D, so that the output of the VCO 4 converges to the target oscillating frequency $f_{vco}$ of the VCO 4 corresponding to the frequency division value Mi input from the CPU. In other words, a quantization error included in the second frequency control loop is compensated for by the first frequency control loop.

This aspect will be described in detail below.

In principle, the second control loop based on frequency difference may be sufficient for the output frequency of the VCO 4 to converge to the target oscillating frequency $f_{vco}$. However, in a receiver using a conventional PLL circuit, a reference signal fr input to a phase comparator 13 has approximately 50 kHz. Thus, if a tuning accuracy as high as before is to be ensured over a reception band extending over 20 MHz, the resolution of a D/A converter must be set so high that this is not suited for practical use. To solve this problem, it is desirable that control loops are appropriately switched, as implemented in the present invention, such that the second frequency control loop based on frequency difference is selected to roughly but promptly adjust the oscillating frequency of the VCO 4 near the target frequency $f_{vco}$ to reduce a lock up time, and then the first frequency control loop based on phase comparison is used to finely adjust the oscillating frequency of the VCO 4 to ensure a high tuning capability for a desired tuning frequency.

Figure 6:
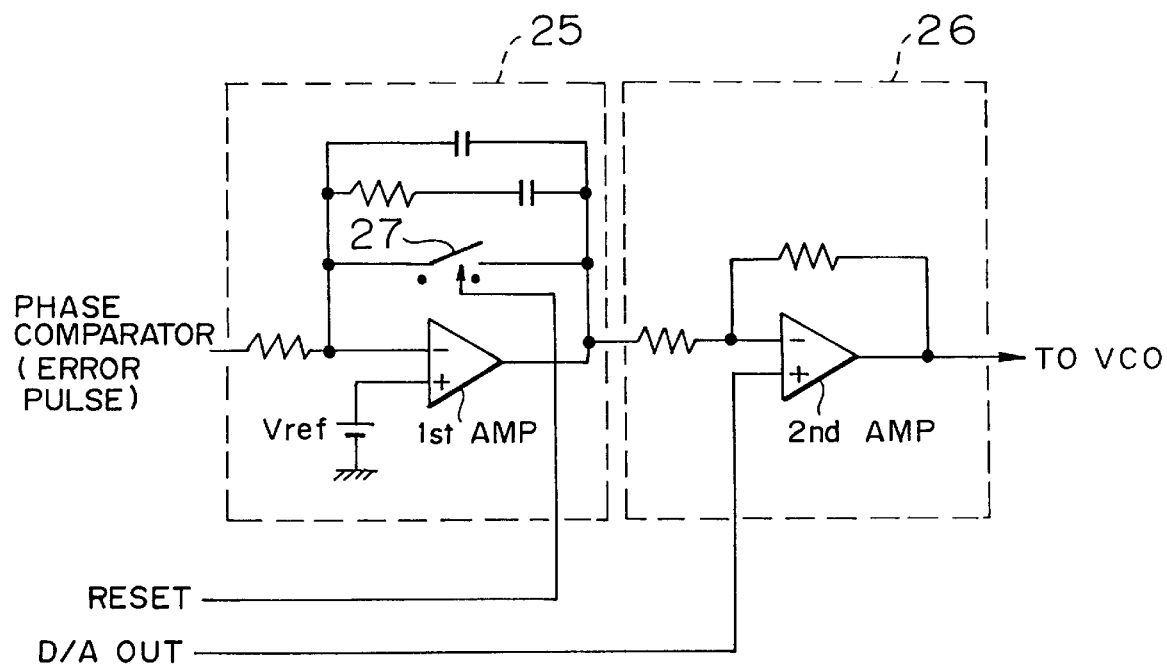
FIG. 6 is a diagram illustrating a specific structure of a loop selector in the oscillation controller of FIG. 3.

Next, specific structure of the loop selector 14 will be described with reference to FIG. 6. The loop selector 14 is composed of a first amplifier (1st AMP) 25 operable as a low pass filter (LPF) and a second amplifier (2nd AMP) 26. The first amplifier 25 serving as an active filter is additionally provided with a switch 27 for short-circuiting its input and output, which is opened and closed under the control of a reset signal from the synchronization controller 20. The second amplifier 26 has two inputs connected to an output of the first amplifier 25 and an output of the D/A converter 19, respectively.

When the reset signal output from the synchronization controller 20 is at high level as illustrated in FIG. 4H, i.e., when the second frequency control loop is selected instead of the first frequency control loop, the switch 27 is closed to short-circuit the input and output of the first amplifier 25. Also, the output of the phase comparator 13 is set to present high impedance. Thus, the second amplifier 26 operates as a buffer amplifier, and an output voltage of the D/A converter 19 is input to the VCO 4 as a control voltage TV through the second amplifier 26, whereby the oscillating frequency of the VCO 4 is controlled by the second frequency control loop.

When the reset signal output from the synchronization controller 20 is at low level as illustrated in FIG. 4H, i.e., when the first frequency control loop is selected instead of the second frequency control loop, the switch 27 is opened to cause the first amplifier 25 to operate as a low pass filter which is set such that an error pulse can be output in accordance with a phase error detected by the phase comparator 13. Then, the control voltage TV smoothed by the first amplifier 25 operating as a low pass filter is input to the VCO 4 through the second amplifier 26, whereby the oscillating frequency of the VCO 4 is controlled by the first frequency control loop.

As described above, according to the present invention, in a receiver having a receiver unit including a VCO and tunable at a plurality of frequencies for demodulating a modulated signal from a received radio signal and outputting a demodulated output, and an oscillation controller which controls an oscillating frequency of the VCO on the basis of information on an input channel selection frequency, the oscillation controller includes a holder for holding the information on the channel selection frequency, a first frequency control loop system for controlling the VCO based on the difference in phase between a reference signal and a comparison signal generated by dividing an output of the VCO based on the information on the channel selection frequency, and a second frequency control loop system for controlling the VCO based on the difference in frequency between the output of the VCO and the channel selection frequency. The oscillation controller appropriately selects the VCO control using the first frequency control loop system and the VCO control using the second frequency control loop system such that the output frequency of the VCO converges to the channel selection frequency and is maintained at the channel selection frequency, thus making it possible to achieve an improved lock up time and a high tuning capability for a desired tuning frequency.

The receiver as mentioned above can be utilized, for example, for network follow in a radio data system using multiplex broadcasting, which has already been put in practical use in Europe. Since station selecting operations such as a check for a receiving circumstance of a substituted broadcasting station and so on can be carried out without relying on muting, it is possible to realize a high grade receiver which never gives a sense of incompatibility to a listener.

Also, since a VCO can be shared, beat interference, which may occur when a plurality of VCO's are built in a receiver, is eliminated.

In the receiver described above, a reference signal is generated by dividing means for dividing a master clock signal, and a synchronization controller, when switching from the VCO control using the second frequency control loop to the VCO control using the first frequency control loop, simultaneously starts a dividing operation for generating the reference signal and the comparison signal, so that the generation of an unnecessary error pulse due to the difference in basic principles between the first and second frequency control loops can be suppressed when switching from the second frequency control loop basing the principle of control on frequency difference to the first frequency control loop basing the principle of control on phase difference.

Also, when the difference between an oscillating frequency of the VCO changed by a control voltage output in accordance with a detected frequency difference and a channel selection frequency is again detected at the time the second frequency control loop is selected, the oscillating frequency of the VCO is not measured until the oscillating frequency of the VCO stably remains at an oscillating frequency in accordance with the frequency difference, making it possible to improve the reliability of the calculated frequency difference.

What is claimed is:

1. A receiver having oscillating means for generating an oscillating signal at an oscillating frequency corresponding to an oscillation control signal, and receiving a radio signal at a tuning frequency corresponding to the oscillating frequency of said oscillating signal to demodulate the received radio signal, comprising:

holding means for holding information on an input channel selection frequency;

phase difference signal generating means for generating a phase difference signal indicative of a difference in phase between a comparison signal and a reference signal, wherein said comparison signal is generated by dividing said oscillating signal by said information on the input channel selection frequency;

a loop filter for removing a high frequency component in said phase difference signal to generate a first control signal;

frequency difference signal generating means for fetching the oscillating frequency of said oscillating means, and for generating a frequency difference signal indicative of a frequency difference between said oscillating frequency of said oscillating signal and a target oscillating frequency corresponding to the input channel selection frequency for each fetching of the oscillating frequency;

means for accumulating said frequency difference signal to generate a second control signal when said frequency difference signal is generated;

means for generating an unlock detection signal when the magnitude of said frequency difference signal is larger than a predetermined value; and adding means for adding said first and second control signals to generate the added result as said oscillation control signal, wherein said loop filter has a switch for short-circuiting its input and output to maintain said first control signal of a constant level when said unlock detection signal is generated.

2. A receiver according to claim 1, wherein said frequency difference signal generating means does not newly fetch the oscillating frequency of said oscillating means until a predetermined period of time passes after fetching the oscillating frequency of said oscillating means.

* * * * *